(12) United States Patent
Morino et al.

(10) Patent No.: US 11,435,702 B2
(45) Date of Patent: Sep. 6, 2022

(54) TIME-TO-DIGITAL CONVERTER

(71) Applicant: Mitsubishi Electric Corporation, Tokyo (JP)

(72) Inventors: Yoshiaki Morino, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/403,388

(22) Filed: Aug. 16, 2021

(65) Prior Publication Data

US 2021/0373503 A1 Dec. 2, 2021

Related U.S. Application Data

(63) Continuation of application No. PCT/JP2019/008901, filed on Mar. 6, 2019.

(51) Int. Cl.
*H03M 1/50* (2006.01)
*G04F 10/00* (2006.01)
*H03M 1/12* (2006.01)
*H03L 7/081* (2006.01)
(Continued)

(52) U.S. Cl.
CPC ............ *G04F 10/005* (2013.01); *H03M 1/12* (2013.01); *H03L 7/081* (2013.01); *H03L 7/083* (2013.01); *H03L 7/0997* (2013.01); *H03L 2207/50* (2013.01)

(58) Field of Classification Search
CPC ...... G04F 10/005; H03M 1/12; H03L 7/0997; H03L 7/081; H03L 2207/50; H03L 7/083
See application file for complete search history.

(56) References Cited

U.S. PATENT DOCUMENTS

| 2011/0292265 A1 | 12/2011 | Takahashi et al. |
| 2012/0104259 A1 | 5/2012 | Mann |
| 2012/0307867 A1* | 12/2012 | Chung ............... G01R 19/0084 374/170 |

FOREIGN PATENT DOCUMENTS

| CN | 103840830 A | 6/2014 |
| JP | 10-111369 A | 4/1998 |
| JP | 2011-254246 A | 12/2011 |

(Continued)

OTHER PUBLICATIONS

International Search Report for PCT/JP2019/008901 filed on Mar. 6, 2019 and dated Jun. 4, 2019.

*Primary Examiner* — Joseph J Lauture
(74) *Attorney, Agent, or Firm* — Birch, Stewart, Kolasch & Birch, LLP

(57) ABSTRACT

In a time-to-digital converter, a digital signal outputted by a phase information generator is inputted to each of the D terminals of first through Nth (N is a natural number equal to or greater than 2) D-type flip-flop circuits in a first flip-flop group, each of the D terminals is connected to one end of a first delay element, the C terminal of the first D-type flip-flop circuit is connected to another end of the first delay element, the other end of the first delay element is connected to an input terminal, and, when N, the number of flip-flop circuits in the first flip-flop group, is equal to or greater than 3, for each J a natural number from 2 to N−1, C terminal of the (J+1)th D-type flip-flop circuit is connected to one end of the Jth delay element and one end of the (J−1)th delay element is connected to the other end of the Jth delay element.

6 Claims, 5 Drawing Sheets

(51) Int. Cl.
*H03L 7/099* (2006.01)
*H03L 7/083* (2006.01)

(56) References Cited

FOREIGN PATENT DOCUMENTS

| JP | 2012-100252 A | 5/2012 |
| WO | WO 2012/066700 A1 | 5/2012 |

* cited by examiner

TIME-TO-DIGITAL CONVERTER

CROSS REFERENCE TO RELATED APPLICATION

This application is a Continuation of PCT International Application No. PCT/JP2019/008901, filed on Mar. 6, 2019, which is hereby expressly incorporated by reference into the present application.

TECHNICAL FIELD

The present disclosure relates to a time-to-digital converter.

BACKGROUND ART

Time-to-digital converters acquire phase information about phases between each delay element connected in series at each of times when two signals are inputted and calculates the time interval between the two inputted signals from the phase difference between the two signals, the phase difference being shown by the acquired phase information.

The resolution of time-to-digital converters is determined from the inverter delay time $\tau$ of inverter elements used. In a case where a time-to-digital converter is a typical one with no ingenuity in the circuit, the minimum resolution of the time-to-digital converter is $\tau$. By shortening the gate lengths of transistors used, the time-to-digital converter is made to have a smaller resolution. However, for example, in a case where the gate lengths of the transistors are already minimum ones, transistors produced through finer semiconductor processing need to be used for the time-to-digital converter.

To solve this problem, Patent Literature 1 discloses a time-to-digital converter including two delay strings each having multiple delay elements connected in series, for delaying a first signal inputted to one of the delay strings by $1/2\tau$, and acquiring a phase difference between each delay element, thereby improving the resolution.

CITATION LIST

Patent Literature

Patent Literature 1: JP 2012-100252 A

SUMMARY OF INVENTION

Technical Problem

However, a problem with the time-to-digital converter disclosed in Patent Literature 1 is that the circuit scale increases because multiple delay elements are needed for each of the delay strings.

The present disclosure is made to solve the above-mentioned problem, and it is therefore an object of the present disclosure to provide a time-to-digital converter that can improve the resolution in measurements of the time interval between a first signal and a second signal without increasing the circuit scale.

Solution to Problem

A time-to-digital converter according to the present disclosure includes: an input terminal to which a first signal and a second signal are inputted at a different time; a phase information generator including an inverter element having inverter delay time $\tau$, the phase information generator outputting multiple digital signals, each of the digital signals having a phase different from one another, the phase shift being an amount corresponding to the inverter delay time $\tau$; a first flip-flop group having first through $N^{th}$ D-type flip-flop circuits, N being a natural number equal to or greater than 2; first through $(N-1)^{th}$ delay elements, each of the delay elements providing a delay time, the delay time being $(N+1)/N$ times the inverter delay time $\tau$; and a time calculator calculating a time interval between a point the first signal being inputted and another point the second signal being inputted from the value outputted by each of the Q terminals of the first through Nth D-type flip-flop circuits.

One of the digital signals corresponding to the first flip-flop group is inputted to all the D terminals of the first through $N^{th}$ D-type flip-flop circuits in the first flip-flop group. The C terminal of the second D-type flip-flop circuit in the first flip-flop group is connected to one end of the first delay element. The C terminal of the first D-type flip-flop circuit in the first flip-flop group is connected to the other end of the first delay element. The other end of the first delay element is connected to the input terminal. When N, the number of flip-flop circuits in the first flip-flop group, is equal to or greater than 3, for each J a natural number from 2 to N−1, C terminal of the $(J+1)^{th}$ D-type flip-flop circuit in the first flip-flop group is connected to one end of the $J^{th}$ delay element and one end of the $(J-1)^{th}$ delay element is connected to the other end of the $J^{th}$ delay element.

Advantageous Effects of Invention

According to the present disclosure, the resolution can be improved in measurements of the time interval between the first signal and the second signal without increasing the circuit scale.

DESCRIPTION OF EMBODIMENTS

Hereinafter, embodiments of the present disclosure will be explained in detail by reference to the drawings.

Embodiment 1

A time-to-digital converter 100 according to Embodiment 1 will be explained by reference to FIGS. 1 and 2.

An example of the configuration of a main part of the time-to-digital converter 100 according to Embodiment 1 will be explained by reference to FIG. 1.

Figure 1:
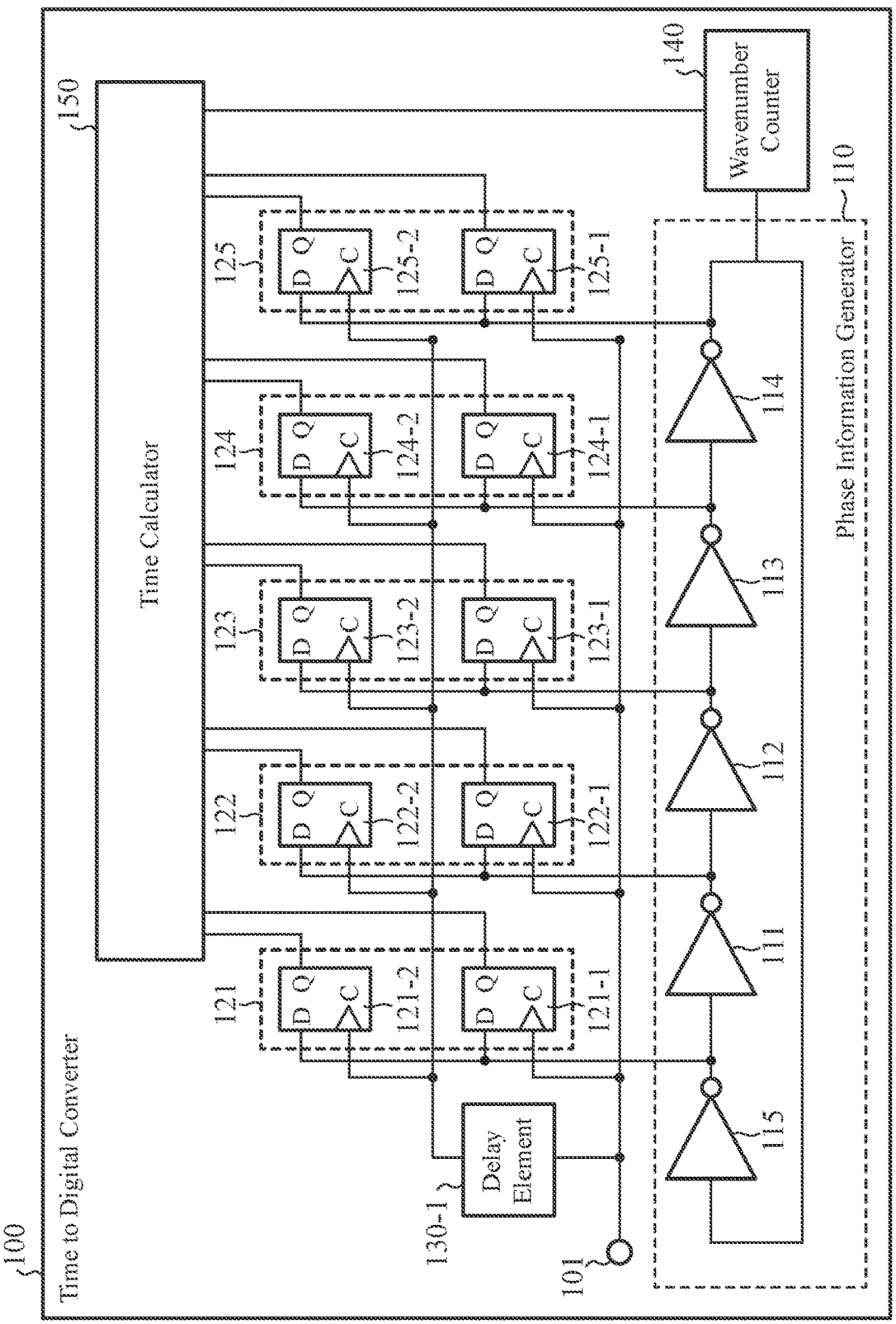
FIG. 1 is a diagram showing an example of the configuration of a main part of a time-to-digital converter according to Embodiment 1.

FIG. 1 is a diagram showing an example of the configuration of the main part of the time-to-digital converter 100 according to Embodiment 1.

The time-to-digital converter 100 according to Embodiment 1 includes an input terminal 101, a phase information generator 110, five flip-flop groups 121, 122, 123, 124, and 125, a single delay element 130-1, a wavenumber counter 140, and a time calculator 150.

The time-to-digital converter 100 according to Embodiment 1 is one, as an example, in which the time-to-digital converter includes the first through fifth five flip-flop groups 121, 122, 123, 124, and 125.

The number of flip-flop groups included in the time-to-digital converter 100 is not limited to five. The number of flip-flop groups can be four or less, six or more, or any number if it is two or more. In other words, the time-to-digital converter 100 can have first through $M^{th}$ (M is a natural number equal to or greater than 2) M flip-flop groups.

The time-to-digital converter 100 shown in FIG. 1 is one, as an example, in which each of the first through fifth five flip-flop groups 121, 122, 123, 124, and 125, has different two D-type flip-flop circuits. The different two D-type flip-flop circuits are a first D-type flip-flop circuit 121-1, 122-1, 123-1, 124-1, or 125-1 and a second D-type flip-flop circuit 121-2, 122-2, 123-2, 124-2, or 125-2.

In the time-to-digital converter 100, the number of D-type flip-flop circuits in each of the first through fifth flip-flop groups 121, 122, 123, 124, and 125 is not limited to two and can be three or more. The number of D-type flip-flop circuits in a group can be any if it is two or more. In other words, the time-to-digital converter 100 can have first through $M^{th}$ M flip-flop groups, each of the M flip-flop groups having different first through $N^{th}$ N D-type flip-flop circuits, N being a natural number equal to or greater than 2.

The time-to-digital converter 100 shown in FIG. 1 is one, as an example, in which the phase information generator 110 includes a ring oscillator having first through fifth five inverter elements 111, 112, 113, 114, and 115. The phase information generator 110 shown in FIG. 1 generates first through fifth digital signals, each of the digital signals having a phase different from one another, the phase shift being an amount corresponding to an inverter delay time τ of each of the first through fifth inverter elements 111, 112, 113, 114, and 115, and outputs the generated first through fifth digital signals. In the time-to-digital converter 100 shown in FIG. 1, respective signals inputted to the first through fifth inverter elements 111, 112, 113, 114, and 115 which the phase information generator 110 has are outputted as the first through fifth digital signals.

The number of inverter elements in the phase information generator 110, the phase information generator 110 being composed of a ring oscillator, is not limited to five. The number of inverter elements can be four or less, six or more, or any as long as the phase information generator 110 has one or more inverter elements each for delaying an inputted signal by the inverter delay time τ, and outputs digital signals, each of the digital signals having a phase different from one another, the phase shift being an amount corresponding to the inverter delay time τ, the number of digital signals being the same as the number of flip-flop groups included in the time-to-digital converter 100. In other words, in a case where the number of flip-flop groups is M and the phase information supply is achieved by a ring oscillator, the phase information generator 110 can have first through $M^{th}$ M inverter elements whose respective time delays are the predetermined time. In a case where the phase information generator 110 is composed of a ring oscillator, it is obvious that the number of inverter elements in the phase information generator 110 is odd.

Further, the phase information generator 110 is not limited to such a unit being composed of a ring oscillator. Concretely, for example, the phase information generator 110 can be a unit using a digital signal inputted from a not-illustrated digital signal oscillator or the like, and having a predetermined period, thereby outputting digital signals, each of the digital signals having a phase different from one another by an amount corresponding to the inverter delay time τ, the number of digital signals being the same as the number of flip-flop groups included in the time-to-digital converter 100.

In other words, in the case where the time-to-digital converter 100 includes M flip-flop groups, the phase information generator 110 can be a unit including first through $(M-1)^{th}$ M−1 inverter elements and outputting first through $M^{th}$ M digital signals, each of the digital signals having a phase different from one another by an amount corresponding to the predetermined time being the inverter delay time τ.

The time-to-digital converter 100 shown in FIG. 1 is one, as an example, in which the first through fifth digital signals outputted by the phase information generator 110 are inputted, respectively, to the D terminals of the first D-type flip-flop circuits 121-1, 122-1, 123-1, 124-1, and 125-1 and the second D-type flip-flop circuits 121-2, 122-2, 123-2, 124-2, and 125-2, each D-type flip-flop circuit belonging to the corresponding group among the first through fifth flip-flop groups 121, 122, 123, 124, and 125.

The time-to-digital converter 100 is not limited to a converter being composed of five flip-flop groups. The time-to-digital converter 100 can be a converter having a phase information generator 110 that outputs same number of digital signals as the number of flip-flop groups in the time-to-digital converter 100. Therefore, a case where the time-to-digital converter 100 includes M flip-flop groups can be thought of. The time-to-digital converter 100 can be a converter wherein, for each K a natural number from 1 to M, the $K^{th}$ digital signal among the multiple digital signals outputted by the phase information generator 110 is inputted to D terminals of the first through $N^{th}$ D-type flip-flop circuits in the $K^{th}$ flip-flop group.

More concretely, in the case where the time-to-digital converter 100 includes M flip-flop groups and each of the M flip-flop groups has different N D-type flip-flop circuits, the time-to-digital converter 100 is configured as follows.

The time-to-digital converter 100 has first through $(M-1)^{th}$ M−1 inverter elements whose respective time delays are the predetermined time.

Each of the D terminals of the first through $N^{th}$ D-type flip-flop circuits in the second flip-flop group 122 is connected to one end of the first inverter element 111.

Each of the D terminals of the first through $N^{th}$ D-type flip-flop circuits in the first flip-flop group 121 is connected to the other end of the first inverter element 111.

When M, the number of flip-flop groups, is equal to or greater than 3, for each L a natural number from 2 to M−1, each of the D terminals of the first through $N^{th}$ D-type flip-flop circuits in the $(L+1)^{th}$ flip-flop group is connected to one end of the $L^{th}$ inverter element.

When M, the number of flip-flop groups, is equal to or greater than 3, for each L a natural number from 2 to M−1, one end of the $(L-1)^{th}$ inverter element is connected to the other end of the $L^{th}$ inverter element.

Further, in the case where the number of flip-flop groups is M and the phase information supply is achieved by a ring oscillator, the time-to-digital converter 100 has the following configuration in addition to the above-mentioned configuration.

The phase information generator 110 has an $M^{th}$ inverter element whose time delay is the predetermined time, in addition to the above-mentioned M−1 inverter elements.

One end of the $M^{th}$ inverter element is connected to the other end of the first inverter element 111.

The other end of the $M^{th}$ inverter element is connected to one end of the $(M-1)^{th}$ inverter element.

With the configuration as above, the phase information generator 110 can output first through $M^{th}$ M digital signals, each of the digital signals having a phase different from one another by an amount corresponding to the inverter delay time τ of each of the first through $M^{th}$ inverter elements, by outputting, as the digital signals, either the signals inputted to the first through $M^{th}$ inverter elements or the signals outputted from the first through $M^{th}$ inverter elements.

Because the time-to-digital converter 100 shown in FIG. 1 is one, as an example, in which each of the first through fifth flip-flop groups 121, 122, 123, 124, and 125 has different first and second two D-type flip-flop circuits, the time-to-digital converter has the first single delay element 130-1.

The number of delay elements 130-1 included in the time-to-digital converter 100 is not limited to one, and, at least, the number can be the same as the result of subtracting 1 from the number of D-type flip-flop circuits in one flip-flop group. In other words, in the case where the first through fifth flip-flop groups 121, 122, 123, 124, and 125 have different first through $N^{th}$ N D-type flip-flop circuits, the time-to-digital converter 100 can have first through $(N-1)^{th}$ N−1 delay elements connected in series.

Because the time-to-digital converter 100 shown in FIG. 1 is one, as an example, in which each of the first through fifth flip-flop groups 121, 122, 123, 124, and 125 has different first and second two D-type flip-flop circuits, the first delay element 130-1 is set up to provide a time delay which is 3/2 times the inverter delay time τ of each of the first through fifth inverter elements 111, 112, 113, 114, and 115 included in the phase information generator 110.

The delay time being set at the first delay element 130-1 is not limited to 3/2 of the inverter delay time τ. The delay time is determined from the number of D-type flip-flop circuits in one flip-flop group included in the time-to-digital converter 100.

Concretely, in the case where each of the first through fifth flip-flop groups 121, 122, 123, 124, and 125 included in the time-to-digital converter 100 has different N D-type flip-flop circuits, the delay time provided by each of the first through $(N-1)^{th}$ delay elements can be (N+1)/N times the predetermined time. More concretely, in the case where the first through fifth flip-flop groups 121, 122, 123, 124, and 125 included in the time-to-digital converter 100 have different N D-type flip-flop circuits, the delay time provided by each of the first through $(N-1)^{th}$ delay elements can be (N+1)/N times the inverter delay time τ of each of the first through fifth inverter elements 111, 112, 113, 114, and 115 included in the phase information generator 110.

The time-to-digital converter 100 shown in FIG. 1 is one, as an example, in which each of the C terminals of the second D-type flip-flop circuits 121-2, 122-2, 123-2, 124-2, and 125-2 in the first through fifth flip-flop groups 121, 122, 123, 124, and 125 is connected to one end of the first delay element 130-1, and each of the C terminals of the first D-type flip-flop circuits 121-1, 122-1, 123-1, 124-1, and 125-1 in the first through fifth flip-flop groups 121, 122, 123, 124, and 125 is connected to the other end of the first delay element 130-1.

In the time-to-digital converter 100, the number of flip-flop groups is not limited to five, and the number of D-type flip-flop circuits in one flip-flop group is not limited to two. In the case where the time-to-digital converter 100 includes M flip-flop groups and each of the M flip-flop groups has different N D-type flip-flop circuits, the time-to-digital converter 100 can be one in which each of the C terminals of the second D-type flip-flop circuits in the first through $M^{th}$ flip-flop groups is connected to one end of the first delay element 130-1, each of the C terminals of the first D-type flip-flop circuits in the first through $M^{th}$ flip-flop groups is connected to the other end of the first delay element 130-1, and, when N, the number of D-type flip-flop circuits in one flip-flop group, is equal to or greater than 3, in each of the flip-flop groups, for each J a natural number from 2 to N−1, C terminal of the $(J+1)^{th}$ D-type flip-flop circuit can be connected to one end of the $J^{th}$ delay element.

The wavenumber counter 140 shown in FIG. 1 receives the fifth digital signal outputted by the phase information generator 110 and measures the wavenumber of the first digital signal. The digital signal on which the wavenumber counter 140 performs a measurement of the wavenumber is not limited to the fifth digital signal. Any one of the multiple digital signals can be chosen to measure the wavenumber.

The time calculator 150 shown in FIG. 1 is connected to each of the Q terminals and the wavenumber counter 140, the Q terminals being terminals of the first D-type flip-flop circuits 121-1, 122-1, 123-1, 124-1, and 125-1 and the second D-type flip-flop circuits 121-2, 122-2, 123-2, 124-2, and 125-2, the D-type flip-flop circuits being circuits of the first through fifth flip-flop groups 121, 122, 123, 124, and 125.

In the time-to-digital converter 100, the number of flip-flop groups is not limited to five, and the number of D-type flip-flop circuits in one flip-flop group is not limited to two. In the case where the time-to-digital converter 100 includes M flip-flop groups and each of the M flip-flop groups has different N D-type flip-flop circuits, the time calculator 150 can be connected to each of the Q terminals of the first through $N^{th}$ D-type flip-flop circuits in each of the first through $M^{th}$ flip-flop groups.

The time calculator 150 calculates the time interval between a point the first signal being inputted to the input terminal 101 and a point the second signal being inputted to the input terminal 101 from the value outputted by each of the Q terminals of the first through $N^{th}$ D-type flip-flop circuits in each of the first through $M^{th}$ flip-flop groups.

The time calculator 150 may calculate the time interval between the first signal and the second signal inputted to the input terminal 101 from both the value outputted by each of the Q terminals and the wavenumber of the digital signal, Q terminals being terminals of the first through $N^{th}$ D-type flip-flop circuits in each of the first through $M^{th}$ flip-flop groups, wavenumber being measured by the wavenumber counter 140.

By configuring the time calculator 150 in such a way that the time calculator calculates the time interval between the first signal and the second signal from both the value outputted by each of the Q terminals of the D-type flip-flop circuits and the wavenumber of the digital signal measured by the wavenumber counter 140, the time-to-digital converter 100 can measure the time interval between the first signal and the second signal without the circuit scale being increased, even when the time interval between the first signal and the second signal is longer than the period of a digital signal outputted by the phase information generator 110, such as the first digital.

The operation of the time-to-digital converter 100 shown in FIG. 1 will be explained by reference to FIG. 2.

Figure 2:
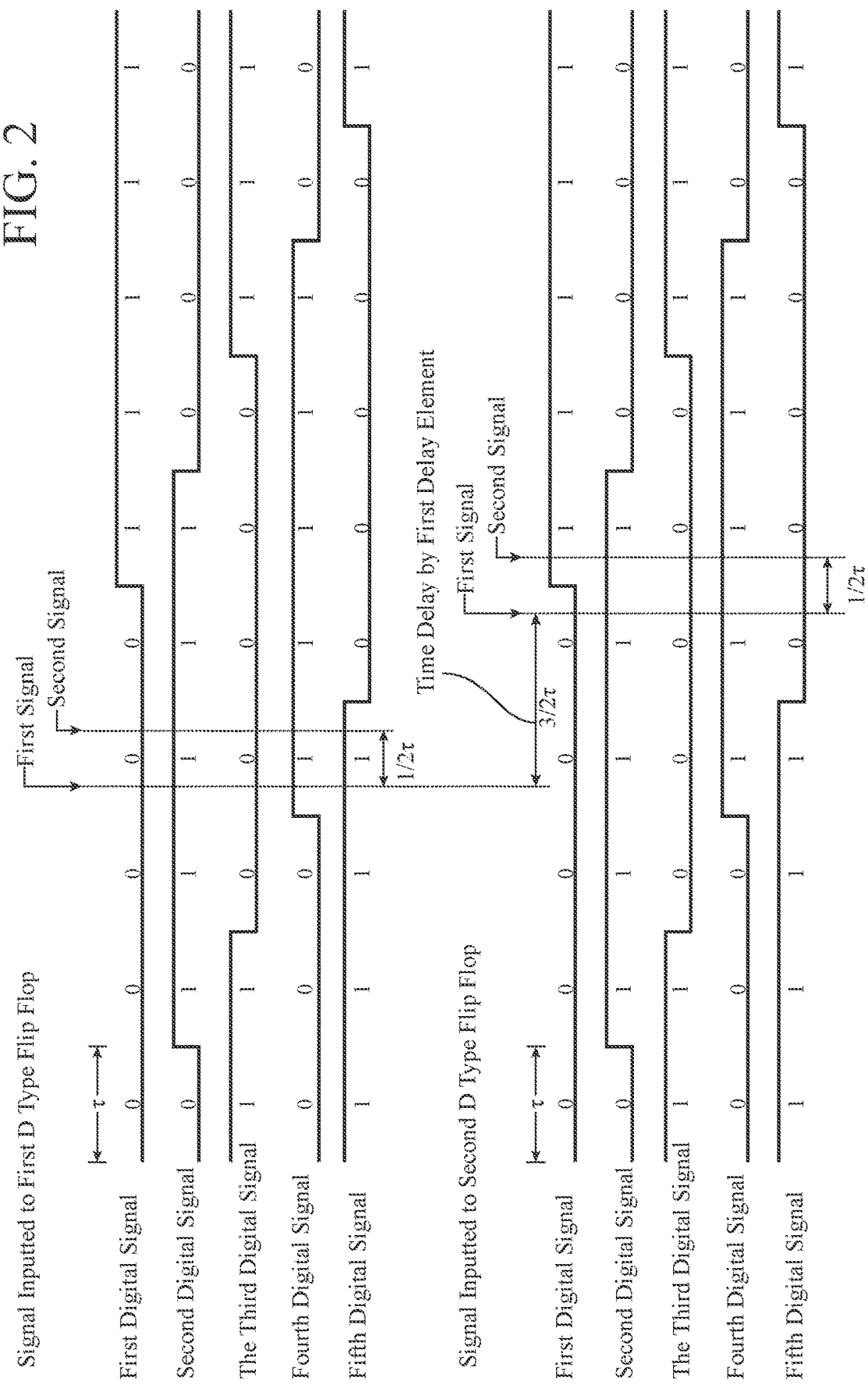
FIG. 2 is timing charts showing an example of temporal changes of digital signals outputted by a phase information generator in the time-to-digital converter shown in FIG. 1, and the timings of a first signal and a second signal inputted to the C terminal of each D type flip-flop circuit.

FIG. 2 is timing charts showing an example of temporal changes of the digital signals outputted by the phase information generator 110 in the time-to-digital converter 100 shown in FIG. 1, and the timings of the first signal and the second signal inputted to the C terminal of each D type flip-flop circuit.

A timing chart shown in an upper row of FIG. 2 shows temporal changes of the first through fifth digital signals inputted to the first D-type flip-flop circuits 121-1, 122-1, 123-1, 124-1, and 125-1 in the first through fifth flip-flop groups 121, 122, 123, 124, and 125. Further, a timing chart shown in a lower row of FIG. 2 shows temporal changes of the first through fifth digital signals inputted to the second D-type flip-flop circuits 121-2, 122-2, 123-2, 124-2, and 125-2 in the first through fifth flip-flop groups 121, 122, 123, 124, and 125.

Because, as an example, the time-to-digital converter 100 shown in FIG. 1 is composed of the ring oscillator having the first through fifth inverter elements 111, 112, 113, 114, and 115, the states of the first through fifth digital signals shown in FIG. 2 change in either one of the first through fifth digital signals every time the inverter delay time τ elapses.

Hereinafter, a case in which the first and second signals with the time interval between them being 1/2τ are inputted to the input terminal 101 at times shown in the timing chart of the upper row of FIG. 2 will be explained.

When the first signal is inputted to each of the C terminals of the first D-type flip-flop circuits 121-1, 122-1, 123-1, 124-1, and 125-1 in the first through fifth flip-flop groups 121, 122, 123, 124, and 125 at the time shown in the timing chart of the upper row of FIG. 2, the states of the first through fifth digital signals are respectively 0, 1, 0, 1, and 1 (expressed by a 5-bit digital value such as "01011" hereinafter). Therefore, the values outputted by the Q terminals of the first D-type flip-flop circuits 121-1, 122-1, 123-1, 124-1, and 125-1 in the first through fifth flip-flop groups 121, 122, 123, 124, and 125 become 0, 1, 0, 1, and 1 (expressed by a 5-bit digital value such as "01011" hereinafter).

For example, in the case where a reset is performed in such a way that the initial values outputted by the Q terminals of the first D-type flip-flop circuits 121-1, 122-1, 123-1, 124-1, and 125-1 in the first through fifth flip-flop groups 121, 122, 123, 124, and 125 are all set to 0, the time calculator 150 can acquire the time that the first signal is inputted, in accordance with the change, from "00000" to "01011", of the values outputted by the Q terminals of the first D-type flip-flop circuits 121-1, 122-1, 123-1, 124-1, and 125-1 in the first through fifth flip-flop groups 121, 122, 123, 124, and 125.

Next, the second signal is inputted after a lapse of 1/2τ since the first signal has been inputted. Because the states of the first through fifth digital signals are "01011" when the second signal is inputted to each of the C terminals of the first D-type flip-flop circuits 121-1, 122-1, 123-1, 124-1, and 125-1 in the first through fifth flip-flop groups 121, 122, 123, 124, and 125 at the time shown in the timing chart of the upper row of FIG. 2, the values outputted by the Q terminals of the first D-type flip-flop circuits 121-1, 122-1, 123-1, 124-1 and 125-1 in the first through fifth flip-flop groups 121, 122, 123, 124 and 125 become "01011."

Because the Q terminals of the first D-type flip-flop circuits 121-1, 122-1, 123-1, 124-1, and 125-1 in the first through fifth flip-flop groups 121, 122, 123, 124, and 125 output "01011" when the first signal is inputted, the time calculator 150 cannot acquire the time that the second signal is inputted from the values outputted by the Q terminals of the first D-type flip-flop circuits 121-1, 122-1, 123-1, 124-1, and 125-1 in the first through fifth flip-flop groups 121, 122, 123, 124, and 125.

Each of the first and second signals is inputted to each of the C terminals of the second D-type flip-flop circuits 121-2, 122-2, 123-2, 124-2, and 125-2 in the first through fifth flip-flop groups 121, 122, 123, 124, and 125 at a time shown in the timing chart of the lower row of FIG. 2, with each of the first and second signals being delayed by the first delay element 130-1 by 3/2τ.

When the first signal is inputted to each of the C terminals of the second D-type flip-flop circuits 121-2, 122-2, 123-2, 124-2, and 125-2 in the first through fifth flip-flop groups 121, 122, 123, 124, and 125 at the time shown in the timing chart of the lower row of FIG. 2, the values outputted by the Q terminals of the second D-type flip-flop circuits 121-2, 122-2, 123-2, 124-2, and 125-2 in the first through fifth flip-flop groups 121, 122, 123, 124, and 125 become "01010."

For example, in the case where a reset is performed in such a way that the initial values outputted by the Q terminals of the second D-type flip-flop circuits 121-2, 122-2, 123-2, 124-2, and 125-2 in the first through fifth flip-flop groups 121, 122, 123, 124, and 125 are all set to 0, the time calculator 150 can acquire the time that the first signal is inputted in accordance with the change, from "00000" to "01010", of the values outputted by the Q terminals of the second D-type flip-flop circuits 121-2, 122-2, 123-2, 124-2, and 125-2 in the first through fifth flip-flop groups 121, 122, 123, 124, and 125.

Next, the second signal is inputted after a lapse of 1/2τ since the first signal has been inputted. When the second signal is inputted to each of the C terminals of the second D-type flip-flop circuits 121-2, 122-2, 123-2, 124-2, and 125-2 in the first through fifth flip-flop groups 121, 122, 123, 124, and 125 at the time shown in the timing chart of the lower row of FIG. 2, the values outputted by the Q terminals of the second D-type flip-flop circuits 121-2, 122-2, 123-2, 124-2, and 125-2 in the first through fifth flip-flop groups 121, 122, 123, 124, and 125 become "11010."

Because the Q terminals of the second D-type flip-flop circuits 121-2, 122-2, 123-2, 124-2, and 125-2 in the first through fifth flip-flop groups 121, 122, 123, 124, and 125 output "01010" when the first signal is inputted, the time calculator 150 can acquire the time that the second signal is inputted in accordance with the change, from "01010" to "11010", of the values outputted by the Q terminals of the second D-type flip-flop circuits 121-2, 122-2, 123-2, 124-2, and 125-2 in the first through fifth flip-flop groups 121, 122, 123, 124, and 125.

The time calculator 150 calculates the time interval between the first signal and the second signal from the value outputted by each of the Q terminals of the first D-type flip-flop circuits 121-1, 122-1, 123-1, 124-1, and 125-1 and the second D-type flip-flop circuits 121-2, 122-2, 123-2, 124-2, and 125-2 in the first through fifth flip-flop groups 121, 122, 123, 124, and 125.

In the example shown in FIG. 2, the time calculator 150 determines that the interval time between the first signal and the second signal is less than 2τ, from the change, from "01010" to "11010", the values outputted by the Q terminals of the second D-type flip-flop circuits 121-2, 122-2, 123-2, 124-2, and 125-2 in the first through fifth flip-flop groups 121, 122, 123, 124, and 125. In addition, because the time calculator 150 cannot acquire the time that the second signal is inputted from the value outputted by each of the Q terminals of the first D-type flip-flop circuits 121-1, 122-1, 123-1, 124-1, and 125-1 in the first through fifth flip-flop groups 121, 122, 123, 124, and 125, the time calculator calculates the time interval between the first signal and the second signal by determining that the time interval between the first signal and the second signal is less than τ.

Because the first and second signals are inputted to each of the C terminals of the second D-type flip-flop circuits 121-2, 122-2, 123-2, 124-2, and 125-2 in the first through fifth flip-flop groups 121, 122, 123, 124, and 125, with the first and second signals being delayed by the first delay element 130-1 by 3/2τ with respect to the input to each of the C terminals of the first D-type flip-flop circuits 121-1, 122-1, 123-1, 124-1, and 125-1 in the first through fifth flip-flop groups 121, 122, 123, 124, and 125, the time calculator 150 can acquire the times that the first and second signals are inputted if the time interval between the first signal and the second signal is equal to or greater than 1/2τ. More specifically, the time-to-digital converter 100 can measure the time interval between the first signal and the second signal with a resolution of 1/2τ in the case where each of the first through fifth flip-flop groups 121, 122, 123, 124, and 125 has different two D-type flip-flop circuits. Further, in this case, the time-to-digital converter 100 can measure the time interval between the first signal and the second signal with an error of measurement of 1/2τ.

Embodiment 2

A time-to-digital converter 100 according to Embodiment 2 will be explained by reference to FIGS. 3 and 4.

The time-to-digital converter 100 according to Embodiment 2 is one in which each of first through fifth flip-flop groups 121, 122, 123, 124, and 125 has different three D-type flip-flop circuits, while the time-to-digital converter 100 according to Embodiment 1 is the one in which each of the first through fifth flip-flop groups 121, 122, 123, 124, and 125 has different two D-type flip-flop circuits.

An example of the configuration of a main part of the time-to-digital converter 100 according to Embodiment 2 will be explained by reference to FIG. 3.

Figure 3:
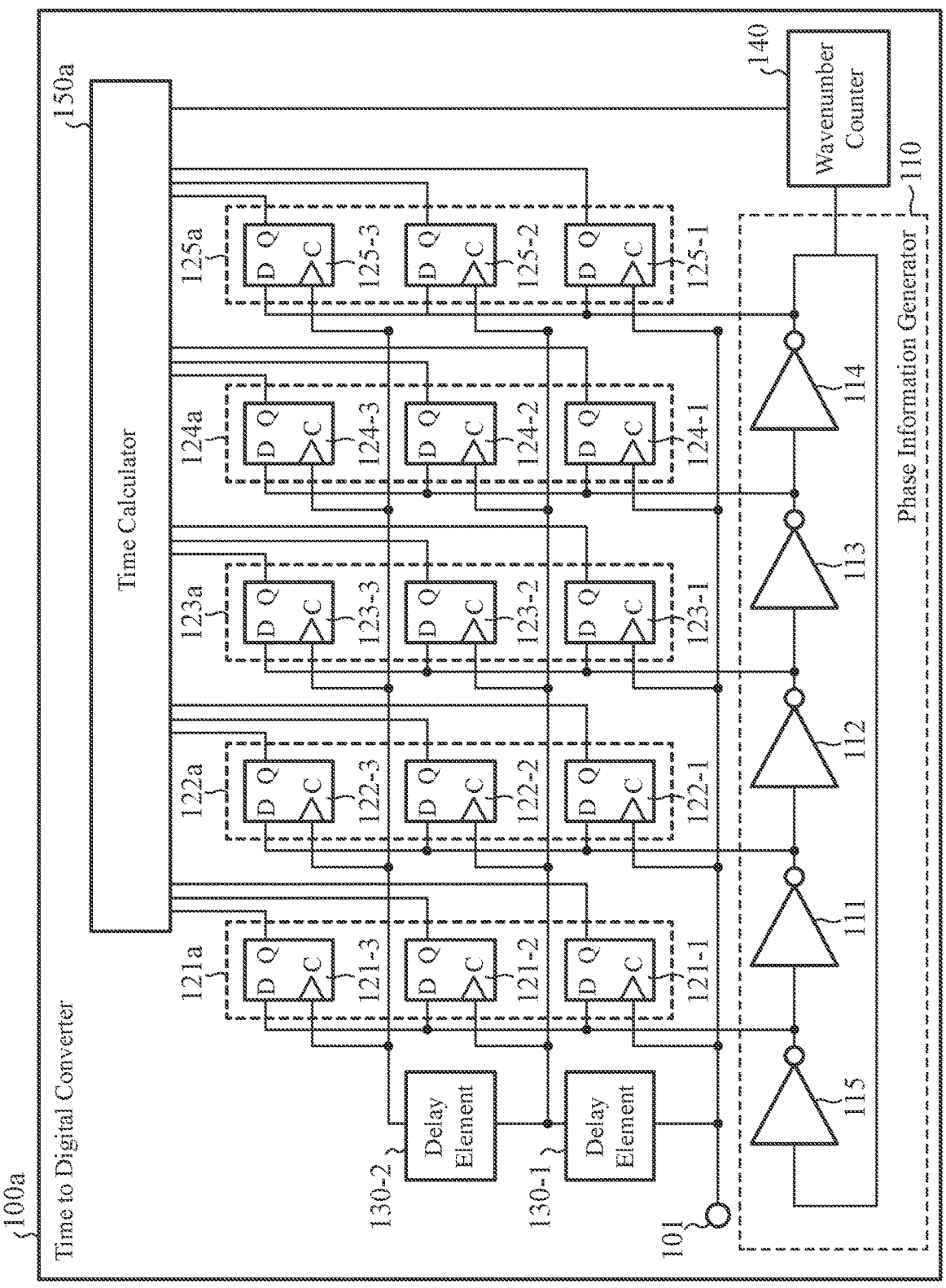
FIG. 3 is a diagram showing an example of the configuration of a main part of a time-to-digital converter according to Embodiment 2.

FIG. 3 is a diagram showing an example of the configuration of the main part of the time-to-digital converter 100 according to Embodiment 2.

The same components as those of the time-to-digital converter 100 according to Embodiment 1 in the configuration of the time-to-digital converter 100 according to Embodiment 2 are denoted by the same reference signs, and a repetitive explanation of the components will be omitted hereinafter. More specifically, an explanation of the components in FIG. 3 which are denoted by the same reference signs as those described in FIG. 1 will be omitted hereinafter.

The time-to-digital converter 100a according to Embodiment 2 includes an input terminal 101, a phase information generator 110, five flip-flop groups 121a, 122a, 123a, 124a, and 125a, two delay elements 130-1 and 130-2, a wavenumber counter 140, and a time calculator 150a.

The time-to-digital converter 100a according to Embodiment 2 is one, as an example, in which the time-to-digital converter includes first through fifth five flip-flop groups 121a, 122a, 123a, 124a, and 125a.

The time-to-digital converter 100a can include first through $M^{th}$ M flip-flop groups.

The time-to-digital converter 100a shown in FIG. 3 is one, as an example, in which each of the first through fifth five flip-flop groups 121a, 122a, 123a, 124a, and 125a has different three D-type flip-flop circuits. The different three D-type flip-flop circuits are first D-type flip-flop circuit 121-1, 122-1, 123-1, 124-1, or 125-1, second D-type flip-flop circuit 121-2, 122-2, 123-2, 124-2, or 125-2, and third D-type flip-flop circuit 121-3, 122-3, 123-3, 124-3, or 125-3.

The time-to-digital converter 100a can be a converter in which each of the first through $M^{th}$ M flip-flop groups has different first through $N^{th}$ N D-type flip-flop circuits.

The time-to-digital converter 100a shown in FIG. 3 is one, as an example, in which the phase information generator 110 is composed of a ring oscillator having first through fifth five inverter elements 111, 112, 113, 114, and 115.

Because the phase information generator 110 according to Embodiment 2 is the same as the phase information generator 110 according to Embodiment 1, an explanation will be omitted hereinafter.

The time-to-digital converter 100a shown in FIG. 3 is one, as an example, in which first through fifth digital signals outputted by the phase information generator 110 are inputted to the respective D terminals, D terminals being terminals of the first D-type flip-flop circuits 121-1, 122-1, 123-1, 124-1, and 125-1, the second D-type flip-flop circuits 121-2, 122-2, 123-2, 124-2, and 125-2, and the third D-type flip-flop circuits 121-3, 122-3, 123-3, 124-3, and 125-3, the D-type flip-flop circuits being circuits of the first through fifth flip-flop groups 121a, 122a, 123a, 124a, and 125a.

In the case where the time-to-digital converter 100a includes M flip-flop groups, the time-to-digital converter 100a can be a converter in which the $K^{th}$ digital signal outputted by the phase information generator 110 is inputted to each of the D terminals of the first through $N^{th}$ D-type flip-flop circuits in the $K^{th}$ flip-flop group.

Because the configuration of the time-to-digital converter 100a in the case where the time-to-digital converter 100a includes M flip-flop groups and each of the M flip-flop groups has different N D-type flip-flop circuits is explained in Embodiment 1, an explanation of the configuration will be omitted hereinafter.

Because the time-to-digital converter 100a shown in FIG. 3 is one, as an example, in which each of the first through fifth flip-flop groups 121a, 122a, 123a, 124a, and 125a has different first through third three D-type flip-flop circuits, the time-to-digital converter 100a has first and second two delay elements 130-1 and 130-2 connected in series.

In the case where the first through fifth flip-flop groups 121a, 122a, 123a, 124a, and 125a have different first through $N^{th}$ N D-type flip-flop circuits, the time-to-digital converter 100a can have first through $(N-1)^{th}$ N−1 delay elements connected in series.

Because the time-to-digital converter 100a shown in FIG. 3 is the one, as an example, in which each of the first through fifth flip-flop groups 121a, 122a, 123a, 124a, and 125a has different first through third three D-type flip-flop circuits, the first delay element 130-1 and the second delay element 130-2 are set up to provide a delay time which is 4/3 times the inverter delay time τ of each of the first through fifth inverter elements 111, 112, 113, 114, and 115 in the phase information generator 110.

In the case where the first through fifth flip-flop groups 121a, 122a, 123a, 124a, and 125a included in the time-todigital converter 100*a* have different N D-type flip-flop circuits, the delay time which each of the first through (N−1)$^{th}$ delay elements provides can be (N+1)/N times a predetermined time. More concretely, in the case where the first through fifth flip-flop groups 121*a*, 122*a*, 123*a*, 124*a*, and 125*a* included in the time-to-digital converter 100*a* have different N D-type flip-flop circuits, the delay time which each of the first through (N−1)$^{th}$ delay elements provides can be (N+1)/N times the inverter delay time τ of each of the first through fifth inverter elements 111, 112, 113, 114, and 115 in the phase information generator 110.

The time-to-digital converter 100*a* shown in FIG. 3 is one, as an example, in which each of the C terminals of the third D-type flip-flop circuit 121-3, 122-3, 123-3, 124-3, and 125-3 is connected to one end of the second delay element 130-2, each of the C terminals of the second D-type flip-flop circuits 121-2, 122-2, 123-2, 124-2, and 125-2 is connected to one end of the first delay element 130-1, and each of the C terminals of the first D-type flip-flop circuits 121-1, 122-1, 123-1, 124-1, and 125-1 is connected to the other end of the first delay element 130-1. First, second and third D-type flip-flop circuits mentioned above belong to the first through fifth flip-flop groups 121*a*, 122*a*, 123*a*, 124*a*, and 125*a*.

In the case where the time-to-digital converter 100*a* includes M flip-flop groups and each of the M flip-flop groups has different N D-type flip-flop circuits, the time-to-digital converter 100*a* can be one in which each of the C terminals of the second D-type flip-flop circuits is connected to one end of the first delay element 130-1, each of the C terminals of the first D-type flip-flop circuits is connected to the other end of the first delay element 130-1, and, when N, the number of flip-flop circuits in one flip-flop group, is equal to or greater than 3, each of the C terminals of the (J+1)$^{th}$ D-type flip-flop circuits is connected to one end of the J$^{th}$ delay element 130-J. First, second and (J+1)$^{th}$ D-type flip-flop circuits mentioned above belongs to the first through M$^{th}$ flip-flop groups.

The time calculator 150*a* shown in FIG. 3 is connected to each of the Q terminals and the wavenumber counter 140, Q terminals being terminals of the first D-type flip-flop circuits 121-1, 122-1, 123-1, 124-1, and 125-1, the second D-type flip-flop circuits 121-2, 122-2, 123-2, 124-2, and 125-2, and the third D-type flip-flop circuits 121-3, 122-3, 123-3, 124-3, and 125-3, first through third D-type flip-flop circuits being circuits of the first through fifth flip-flop groups 121*a*, 122*a*, 123*a*, 124*a*, and 125*a*.

In the case where the time-to-digital converter 100*a* includes M flip-flop groups and each of the M flip-flop groups has different N D-type flip-flop circuits, the time calculator 150*a* can be connected to each of the Q terminals of the first through N$^{th}$ D-type flip-flop circuits in each of the first through M$^{th}$ flip-flop groups. Further, in the case where the time-to-digital converter 100*a* includes M flip-flop groups and each of the M flip-flop groups has different N D-type flip-flop circuits, the time calculator 150*a* may be connected to the wavenumber counter 140 in addition to the connection to each of the Q terminals of the first through N$^{th}$ D-type flip-flop circuits in each of the first through M$^{th}$ flip-flop groups.

The time calculator 150*a* calculates the time interval between a first signal and a second signal inputted to the input terminal 101 from a value outputted by each of the Q terminals of the first through N$^{th}$ D-type flip-flop circuits in each of the first through M$^{th}$ flip-flop groups.

The time calculator 150*a* may calculate the time interval between the first signal and the second signal inputted to the input terminal 101 from both the value outputted by each of the Q terminals and the wavenumber of a digital signal, Q terminals being terminals of the first through N$^{th}$ D-type flip-flop circuits in each of the first through M$^{th}$ flip-flop groups, wavenumber being measured by the wavenumber counter 140.

The operation of the time-to-digital converter 100*a* shown in FIG. 3 will be explained by reference to FIG. 4.

Figure 4:
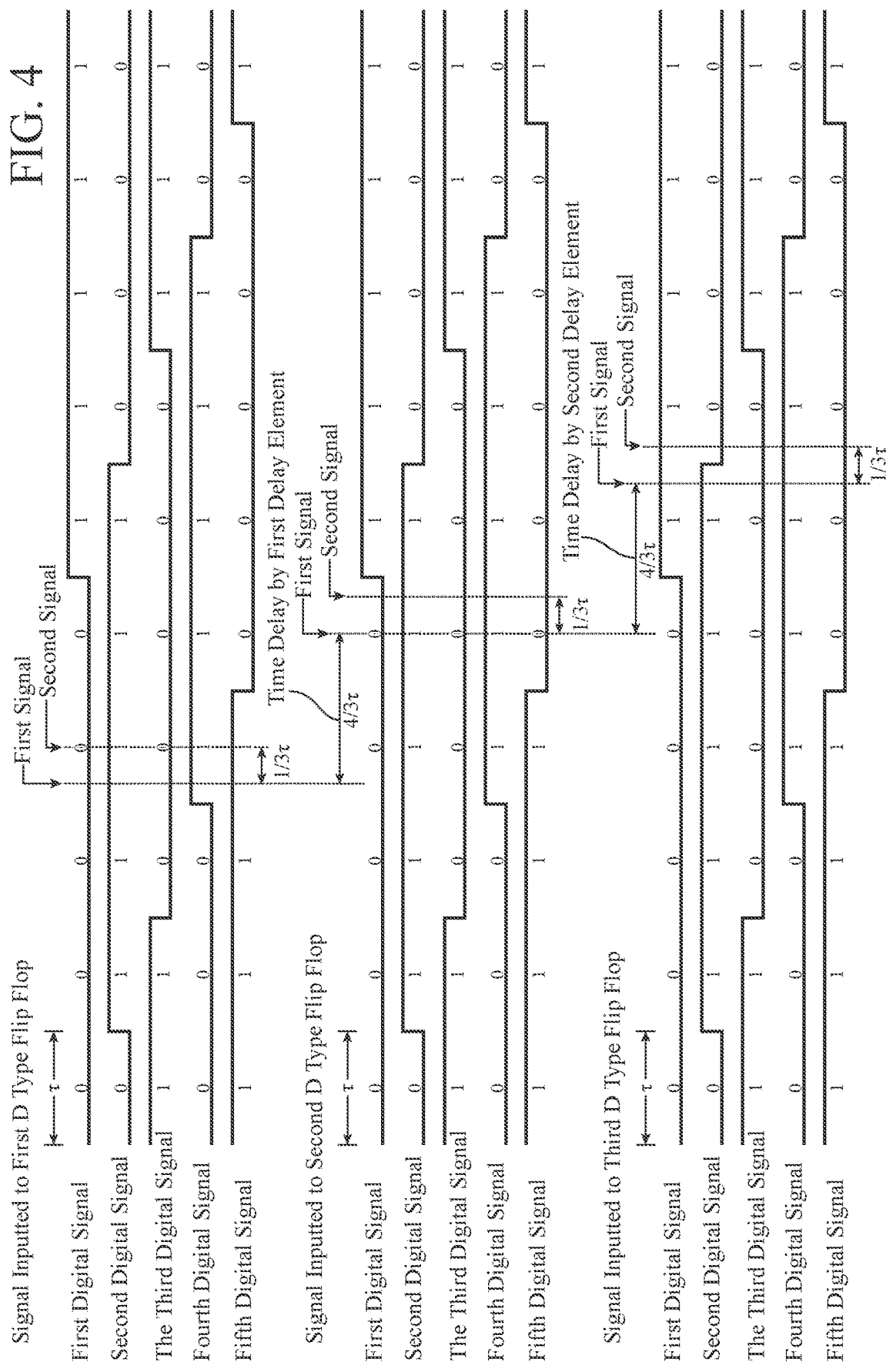
FIG. 4 is timing charts showing an example of temporal changes of digital signals outputted by a phase information generator in the time-to-digital converter shown in FIG. 3, and the timings of a first signal and a second signal inputted to the C terminal of each D type flip-flop circuit.

FIG. 4 is timing charts showing an example of temporal changes of the digital signals outputted by the phase information generator 110 in the time-to-digital converter 100*a* shown in FIG. 3, and the timings of the first signal and the second signal inputted to the C terminal of each D type flip-flop circuit.

A timing chart shown in an upper row of FIG. 4 shows temporal changes of the first through fifth digital signals inputted to the first D-type flip-flop circuits 121-1, 122-1, 123-1, 124-1, and 125-1 in the first through fifth flip-flop groups 121*a*, 122*a*, 123*a*, 124*a*, and 125*a*. Further, a timing chart shown in a middle row of FIG. 4 shows temporal changes of the first through fifth digital signals inputted to the second D-type flip-flop circuits 121-2, 122-2, 123-2, 124-2, and 125-2 in the first through fifth flip-flop groups 121*a*, 122*a*, 123*a*, 124*a*, and 125*a*. Further, a timing chart shown in a lower row of FIG. 4 shows temporal changes of the first through fifth digital signals inputted to the third D-type flip-flop circuits 121-3, 122-3, 123-3, 124-3, and 125-3 in the first through fifth flip-flop groups 121*a*, 122*a*, 123*a*, 124*a*, and 125*a*.

Because, as an example, the time-to-digital converter 100*a* shown in FIG. 3 is composed of the ring oscillator having the five inverter elements 111, 112, 113, 114, and 115, the states of the first through fifth digital signals shown in FIG. 4 change in either one of the first through fifth digital signals every time the inverter delay time τ elapses.

Hereinafter, a case in which the first and second signals with the time interval between them being 1/3τ are inputted to the input terminal 101 at times shown in the timing chart of the upper row of FIG. 4 will be explained.

When the first signal is inputted to each of the C terminals of the first D-type flip-flop circuits 121-1, 122-1, 123-1, 124-1, and 125-1 in the first through fifth flip-flop groups 121*a*, 122*a*, 123*a*, 124*a*, and 125*a* at the time shown in the timing chart of the upper row of FIG. 4, the values outputted by the Q terminals of the first D-type flip-flop circuits 121-1, 122-1, 123-1, 124-1, and 125-1 in the first through fifth flip-flop groups 121*a*, 122*a*, 123*a*, 124*a*, and 125*a* become "01011."

For example, in the case where a reset is performed in such a way that the initial values outputted by the Q terminals of the first D-type flip-flop circuits 121-1, 122-1, 123-1, 124-1, and 125-1 in the first through fifth flip-flop groups 121*a*, 122*a*, 123*a*, 124*a*, and 125*a* are all set to 0, the time calculator 150*a* can acquire the time that the first signal is inputted in accordance with the change, from "00000" to "01011", of the values outputted by the Q terminals of the first D-type flip-flop circuits 121-1, 122-1, 123-1, 124-1, and 125-1 in the first through fifth flip-flop groups 121*a*, 122*a*, 123*a*, 124*a*, and 125*a*.

Next, the second signal is inputted after a lapse of 1/3τ since the first signal has been inputted. When the second signal is inputted to each of the C terminals of the first D-type flip-flop circuits 121-1, 122-1, 123-1, 124-1, and 125-1 in the first through fifth flip-flop groups 121*a*, 122*a*, 123*a*, 124*a*, and 125*a* at the time shown in the timing chart of the upper row of FIG. 4, the values outputted by the Q terminals of the first D-type flip-flop circuits 121-1, 122-1, 123-1, 124-1, and 125-1 in the first through fifth flip-flop groups 121a, 122a, 123a, 124a, and 125a become "01011."

Because the Q terminals of the first D-type flip-flop circuits 121-1, 122-1, 123-1, 124-1, and 125-1 in the first through fifth flip-flop groups 121a, 122a, 123a, 124a, and 125a output "01011" when the first signal is inputted, the time calculator 150 cannot acquire the time that the second signal is inputted from the value outputted by each of the Q terminals of the first D-type flip-flop circuits 121-1, 122-1, 123-1, 124-1, and 125-1 in the first through fifth flip-flop groups 121a, 122a, 123a, 124a, and 125a.

Each of the first and second signals is inputted to each of the C terminals of the second D-type flip-flop circuits 121-2, 122-2, 123-2, 124-2, and 125-2 in the first through fifth flip-flop groups 121a, 122a, 123a, 124a, and 125a at times shown in the timing chart of the middle row of FIG. 4, with each of the first and second signals being delayed by the first delay element 130-1 by 4/3τ.

When the first signal is inputted to each of the C terminals of the second D-type flip-flop circuits 121-2, 122-2, 123-2, 124-2, and 125-2 in the first through fifth flip-flop groups 121a, 122a, 123a, 124a, and 125a at the time shown in the timing chart of the middle row of FIG. 4, the values outputted by the Q terminals of the second D-type flip-flop circuits 121-2, 122-2, 123-2, 124-2, and 125-2 in the first through fifth flip-flop groups 121a, 122a, 123a, 124a, and 125a become "01010."

For example, in the case where a reset is performed in such a way that the initial values outputted by the Q terminals of the second D-type flip-flop circuits 121-2, 122-2, 123-2, 124-2, and 125-2 in the first through fifth flip-flop groups 121a, 122a, 123a, 124a, and 125a are all set to 0, the time calculator 150a can acquire the time that the first signal is inputted in accordance with the change, from "00000" to "01010", of the values outputted by the Q terminals of the second D-type flip-flop circuits 121-2, 122-2, 123-2, 124-2, and 125-2 in the first through fifth flip-flop groups 121a, 122a, 123a, 124a, and 125a.

Next, the second signal is inputted after a lapse of 1/3τ since the first signal has been inputted.

When the second signal is inputted to each of the C terminals of the second D-type flip-flop circuits 121-2, 122-2, 123-2, 124-2, and 125-2 in the first through fifth flip-flop groups 121a, 122a, 123a, 124a, and 125a at the time shown in the timing chart of the middle row of FIG. 4, the values outputted by the Q terminals of the second D-type flip-flop circuits 121-2, 122-2, 123-2, 124-2, and 125-2 in the first through fifth flip-flop groups 121a, 122a, 123a, 124a, and 125a become "01010."

Because the Q terminals of the second D-type flip-flop circuits 121-2, 122-2, 123-2, 124-2, and 125-2 in the first through fifth flip-flop groups 121a, 122a, 123a, 124a, and 125a output "01010" when the first signal is inputted, the time calculator 150 cannot acquire the time that the second signal is inputted from the value outputted by each of the Q terminals of the second D-type flip-flop circuits 121-2, 122-2, 123-2, 124-2, and 125-2 in the first through fifth flip-flop groups 121a, 122a, 123a, 124a, and 125a.

Each of the first and second signals is inputted to each of the C terminals of the third D-type flip-flop circuits 121-3, 122-3, 123-3, 124-3, and 125-3 in the first through fifth flip-flop groups 121a, 122a, 123a, 124a, and 125a at times shown in the timing chart of the lower row of FIG. 4, with each of the first and second signals being delayed by the first and second delay elements 130-1 and 130-2 by 8/3τ.

When the first signal is inputted to each of the C terminals of the third D-type flip-flop circuits 121-3, 122-3, 123-3, 124-3, and 125-3 in the first through fifth flip-flop groups 121a, 122a, 123a, 124a, and 125a at the time shown in the timing chart of the lower row of FIG. 4, the values outputted by the Q terminals of the third D-type flip-flop circuits 121-3, 122-3, 123-3, 124-3, and 125-3 in the first through fifth flip-flop groups 121a, 122a, 123a, 124a, and 125a become "11010."

For example, in the case where a reset is performed in such a way that the initial values outputted by the Q terminals of the third D-type flip-flop circuits 121-3, 122-3, 123-3, 124-3, and 125-3 in the first through fifth flip-flop groups 121a, 122a, 123a, 124a, and 125a are all set to 0, the time calculator 150a can acquire the time that the first signal is inputted in accordance with the change, from "00000" to "11010", of the values outputted by the Q terminals of the third D-type flip-flop circuits 121-3, 122-3, 123-3, 124-3, and 125-3 in the first through fifth flip-flop groups 121a, 122a, 123a, 124a, and 125a.

Next, the second signal is inputted after a lapse of 1/3τ since the first signal has been inputted.

When the second signal is inputted to each of the C terminals of the third D-type flip-flop circuits 121-3, 122-3, 123-3, 124-3, and 125-3 in the first through fifth flip-flop groups 121a, 122a, 123a, 124a, and 125a at the time shown in the timing chart of the lower row of FIG. 4, the values outputted by the Q terminals of the third D-type flip-flop circuits 121-3, 122-3, 123-3, 124-3, and 125-3 in the first through fifth flip-flop groups 121a, 122a, 123a, 124a, and 125a become "10010."

Because the Q terminals of the third D-type flip-flop circuits 121-3, 122-3, 123-3, 124-3, and 125-3 in the first through fifth flip-flop groups 121a, 122a, 123a, 124a, and 125a output "11010" when the first signal is inputted, the time calculator 150 can acquire the time that the second signal is inputted in accordance with the change, from "11010" to "10010", of the values outputted by the Q terminals of the third D-type flip-flop circuits 121-3, 122-3, 123-3, 124-3, and 125-3 in the first through fifth flip-flop groups 121a, 122a, 123a, 124a, and 125a.

The time calculator 150a calculates the time interval between the first signal and the second signal from the value outputted by each of the Q terminals of the first D-type flip-flop circuits 121-1, 122-1, 123-1, 124-1, and 125-1, the second D-type flip-flop circuits 121-2, 122-2, 123-2, 124-2, and 125-2, and the third D-type flip-flop circuits 121-3, 122-3, 123-3, 124-3, and 125-3 in the first through fifth flip-flop groups 121a, 122a, 123a, 124a, and 125a.

In the example shown in FIG. 4, the time calculator 150a determines that the time interval between the first signal and the second signal is less than 2τ from the change, from "01010" to "11010", of the values outputted by the Q terminals of the third D-type flip-flop circuits 121-3, 122-3, 123-3, 124-3, and 125-3 in the first through fifth flip-flop groups 121a, 122a, 123a, 124a, and 125a. Further, because the time calculator 150a cannot acquire the time that the second signal is inputted by using the value outputted from each of the Q terminals of the first D-type flip-flop circuits 121-1, 122-1, 123-1, 124-1, and 125-1 in the first through fifth flip-flop groups 121a, 122a, 123a, 124a, and 125a, the time calculator determines that the time interval between the first signal and the second signal is less than τ. In addition, because the time calculator 150a cannot acquire the time that the second signal is inputted from the value outputted by each of the Q terminals of the second D-type flip-flop circuits 121-2, 122-2, 123-2, 124-2, and 125-2 in the first through fifth flip-flop groups 121a, 122a, 123a, 124a, and 125a, the time calculator calculates the time interval between the first signal and the second signal by determining that the time interval between the first signal and the second signal is less than 2/3τ.

The first and second signals are inputted to each of the C terminals of the second D-type flip-flop circuits 121-2, 122-2, 123-2, 124-2, and 125-2 in the first through fifth flip-flop groups 121a, 122a, 123a, 124a, and 125a, with the first and second signals being delayed by the first delay element 130-1 by 4/3τ with respect to the input to each of the C terminals of the first D-type flip-flop circuits 121-1, 122-1, 123-1, 124-1, and 125-1 in the first through fifth flip-flop groups 121a, 122a, 123a, 124a, and 125a. Further, the first and second signals are inputted to each of the C terminals of the third D-type flip-flop circuits 121-3, 122-3, 123-3, 124-3, and 125-3 in the first through fifth flip-flop groups 121a, 122a, 123a, 124a, and 125a, with the first and second signals being delayed by the first delay element 130-1 by 8/3τ with respect to the input to each of the C terminals of the first D-type flip-flop circuits 121-1, 122-1, 123-1, 124-1, and 125-1 in the first through fifth flip-flop groups 121a, 122a, 123a, 124a, and 125a.

Because the first and second signals are inputted to each of the C terminals of the first D-type flip-flop circuits 121-1, 122-1, 123-1, 124-1, and 125-1, the second D-type flip-flop circuits 121-2, 122-2, 123-2, 124-2, and 125-2, and the third D-type flip-flop circuits 121-3, 122-3, 123-3, 124-3, and 125-3 in the first through fifth flip-flop groups 121a, 122a, 123a, 124a, and 125a, the time calculator 150a can acquire the times that the first and second signals are inputted if the time interval between the first signal and the second signal is equal to or greater than 1/3τ. More specifically, in the case where each of the first through fifth flip-flop groups 121a, 122a, 123a, 124a, and 125a has different three D-type flip-flop circuits, the time-to-digital converter 100a can measure the time interval between the first signal and the second signal with a resolution of 1/3τ. Further, in this case, the time-to-digital converter 100a can measure the time interval between the first signal and the second signal with an error of measurement of 1/3τ.

As explained in Embodiments 1 and 2, in the case where each of the first through fifth flip-flop groups 121a, 122a, 123a, 124a, and 125a has different two D-type flip-flop circuits, the time-to-digital converter 100 can measure the time interval between the first signal and the second signal with a resolution of 1/2τ. Further, in the case where each of the first through fifth flip-flop groups 121a, 122a, 123a, 124a, and 125a has different three D-type flip-flop circuits, the time-to-digital converter 100a can measure the time interval between the first signal and the second signal with a resolution of 1/3τ.

In the case where each of the first through fifth flip-flop groups 121a, 122a, 123a, 124a, and 125a has different N D-type flip-flop circuits, the time-to-digital converter 100 or the time-to-digital converter 100a can measure the time interval between the first signal and the second signal with a resolution of 1/Nτ in the same way as Embodiment 1 or 2.

As mentioned above, the time-to-digital converter 100 or the time-to-digital converter 100a is configured in such a way that the time-to-digital converter includes: the input terminal 101 to which first and second signals are inputted at a different time, signals being digital signals; the phase information generator 110 outputting a digital signal; the first through $M^{th}$ M flip-flop groups, each having different first through $N^{th}$ D-type flip-flop circuits; and the first through $(N-1)^{th}$ delay elements connected in series, each of the delay elements providing a delay time longer than a predetermined time. The phase information generator 110 outputs first through $M^{th}$ digital signals, each of the digital signals having a phase different from one another by an amount corresponding to the predetermined time. The $K^{th}$ digital signal outputted by the phase information generator 110 is inputted to each of the D terminals of the first through $N^{th}$ D-type flip-flop circuits in the $K^{th}$ flip-flop group. Each of the C terminals of the second D-type flip-flop circuits in the first through $M^{th}$ flip-flop groups is connected to one end of the first delay element 130-1. Each of the C terminals of the first D-type flip-flop circuits in the first through $M^{th}$ flip-flop groups is connected to the other end of the first delay element 130-1. When N, the number of D-type flip-flop circuits in one flip-flop group, is equal to or greater than 3, each of the C terminals of the $(J+1)^{th}$ D-type flip-flop circuits in the first through $M^{th}$ flip-flop groups is connected to one end of the $J^{th}$ delay element 130-1.

With the configuration as above, the time-to-digital converter 100 or the time-to-digital converter 100a can improve the resolution in measurements of the time interval between the first signal and the second signal without increasing the circuit scale.

Further, the time-to-digital converter 100 or the time-to-digital converter 100a is configured in such a way that each of the first through $(N-1)^{th}$ delay elements provides a time delay equivalent to $(N+1)/N$ times the predetermined time.

With the configuration as above, the time-to-digital converter 100 or the time-to-digital converter 100a can improve the resolution up to 1/N times the predetermined time in measurements of the time interval between the first signal and the second signal without increasing the circuit scale.

Further, the time-to-digital converter 100 or the time-to-digital converter 100a is configured in such a way that the time-to-digital converter includes the phase information generator 110 having the first through $(M-1)^{th}$ inverter elements whose respective time delays are the predetermined time, and the phase information generator 110 outputs the first through $M^{th}$ M digital signals, each of the digital signals having a phase different from one another by an amount corresponding to the inverter delay time τ of each of the first through $(M-1)^{th}$ inverter elements, by outputting, as digital signals, either signals inputted to the first through $(M-1)^{th}$ inverter elements or signals outputted from the first through $(M-1)^{th}$ inverter elements.

With the configuration as above, the time-to-digital converter 100 or the time-to-digital converter 100a can improve the resolution up to 1/N times the inverter delay time τ of each of the first through $(M-1)^{th}$ inverter elements in measurements of the time interval between the first signal and the second signal without increasing the circuit scale.

The time-to-digital converter 100 or the time-to-digital converter 100a may be configured in such a way that the time-to-digital converter includes the wavenumber counter 140 for measuring the wavenumber of a digital signal outputted by the phase information generator 110, and the time calculator 150a calculates the time interval between the first signal and the second signal inputted to the input terminal 101 from both the value outputted by each of the Q terminals of the first through $N^{th}$ D-type flip-flop circuits in each of the first through $M^{th}$ flip-flop groups and the wavenumber of the digital signal measured by the wavenumber counter 140.

With the configuration as above, the time-to-digital converter 100 or the time-to-digital converter 100a can measure the time interval between the first signal and the second signal with a high resolution without increasing the circuit scale, even when the time interval between the first signal and the second signal is longer than the period of a digital signal such as the first digital signal outputted by the phase information generator 110.

Figure 5:
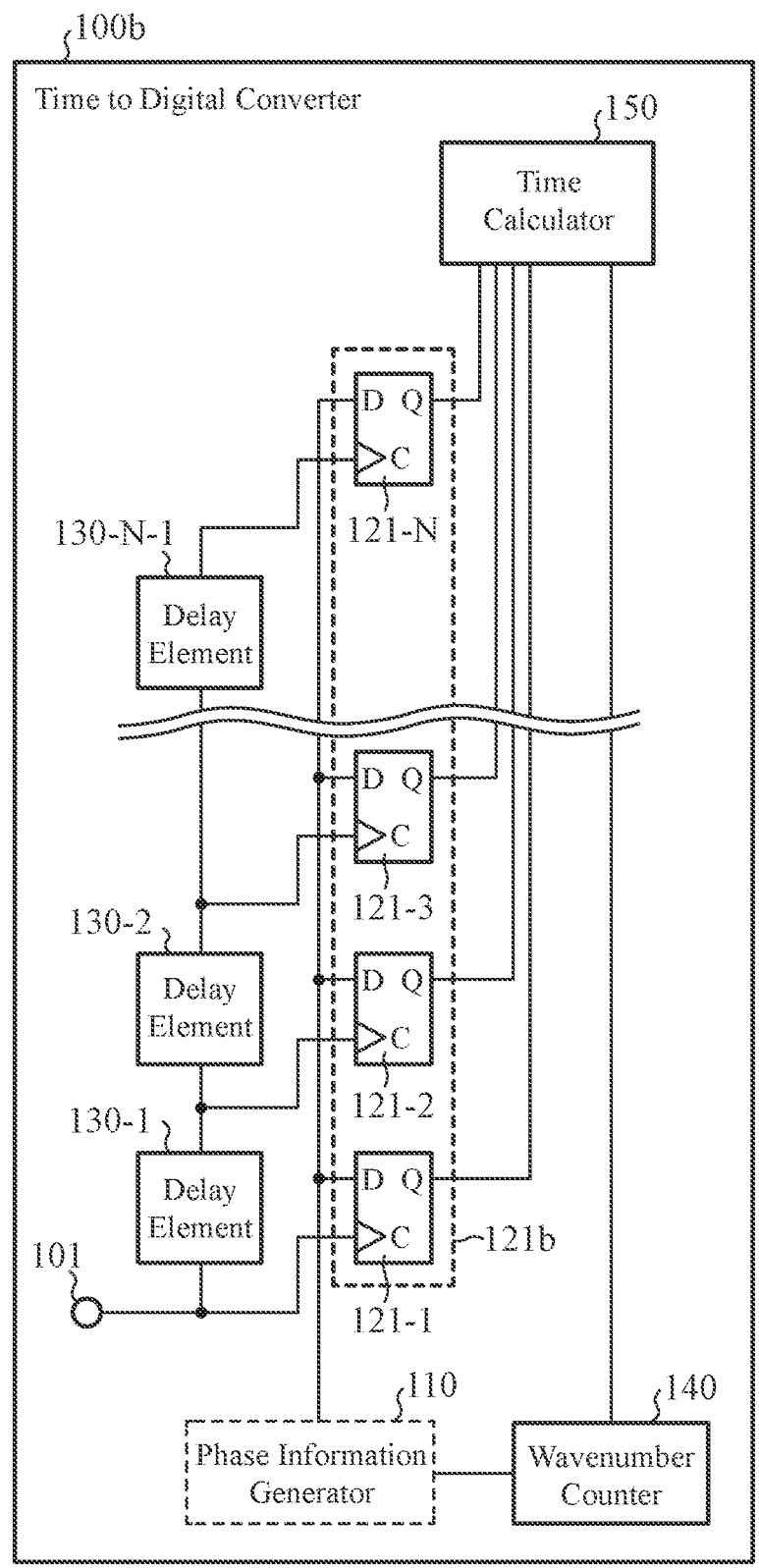
FIG. 5 is a diagram showing an example of the configuration of a main part of a time-to-digital converter including only one flip-flop group.

FIG. 5 is a diagram showing an example of the configuration of a main part of a time-to-digital converter 100b including only one flip-flop group.

Either one of the time-to-digital converters explained so far was a converter including more than one flip-flop groups. That is, both the time-to-digital converter 100 according to Embodiment 1 and the time-to-digital converter 100a according to Embodiment 2 were converters including multiple flip-flop groups 121a, 122a, 123a, 124a, and 125a. However, the time-to-digital converter 100 or the time-to-digital converter 100a can be a converter including only one flip-flop group which is the first flip-flop group 121, like the time-to-digital converter 100b shown in FIG. 5.

More specifically, the time-to-digital converter 100b is configured in such a way that the time-to-digital converter includes: an input terminal 101 to which a first and second signal are inputted at a different time, signals being digital signals; a phase information generator 110 outputting a digital signal; a first flip-flop group 121b having first through $N^{th}$ D-type flip-flop circuits 121-1, 121-2, 121-3, ..., and 121-N; first through $(N-1)^{th}$ delay elements 130-1, 130-2, ..., and 130-(N-1) connected in series, each providing a time delay longer than a predetermined time.

The digital signal outputted by the phase information generator 110 is inputted to each of the D terminals of the first through $N^{th}$ D-type flip-flop circuits 121-1, 121-2, 121-3, ..., and 121-N in the first flip-flop group 121b. The C terminal of the second D-type flip-flop circuit 121-2 in the first flip-flop group 121b is connected to one end of the first delay element 130-1. The C terminal of the first D-type flip-flop circuit 121-1 in the first flip-flop group 121b is connected to the other end of the first delay element 130-1. The other end of the first delay element 130-1 is connected to the input terminal 101. When N, the number of flip-flop circuits in one flip-flop group, is equal to or greater than 3, each C terminal of the $(J+1)^{th}$ D-type flip-flop circuit in the first flip-flop group 121b is connected to one end of the $J^{th}$ delay element and one end of the $(J-1)^{th}$ delay element is connected to the other end of the $J^{th}$ delay element.

With the configuration as above, the time-to-digital converter 100b can improve the resolution in measurements of the time interval between the first signal and the second signal without increasing the circuit scale.

It is to be understood that an arbitrary combination of two of the above-mentioned embodiments can be made, various changes can be made in an arbitrary component according to any one of the above-mentioned embodiments, or an arbitrary component according to any one of the above-mentioned embodiments can be omitted within the scope of the present disclosure.

INDUSTRIAL APPLICABILITY

The time-to-digital converter according to the present disclosure can be applied to measurement equipment that measures physical quantity such as position, distance, speed, temperature, or a flow rate, or can be applied to A/D converters, or the likes.

REFERENCE SIGNS LIST 100, 100a, 100b time-to-digital converter, 101 input terminal, 110 phase information generator, 111 first inverter element, 112 second inverter element, 113 third inverter element, 114 fourth inverter element, 115 fifth inverter element, 121, 121a, 121b first flip-flop group, 122, 122a second flip-flop group, 123, 123a third flip-flop group, 124, 124a fourth flip-flop group, 125, 125a fifth flip-flop group, 121-1, 122-1, 123-1, 124-1, 125-1 first D-type flip-flop circuit, 121-2, 122-2, 123-2, 124-2, 125-2 second D-type flip-flop circuit, 121-3, 122-3, 123-3, 124-3, 125-3 third D-type flip-flop circuit, 121-N $N^{th}$ D-type flip-flop circuit, 130-1 first delay element, 130-2 second delay element, 130-N-1 $(N-1)^{th}$ delay element, 140 wavenumber counter, and 150, 150a time calculator.

The invention claimed is:

1. A time-to-digital converter comprising:
an input terminal to which a first signal and a second signal are inputted at a different time;
a phase information generator including an inverter element having inverter delay time τ, the phase information generator outputting multiple digital signals, each of the digital signals having a phase different from one another, the phase shift being an amount corresponding to the inverter delay time τ;
a first flip-flop group having first through $N^{th}$ D-type flip-flop circuits, N being a natural number equal to or greater than 2;
first through $(N-1)^{th}$ delay elements, each of the delay elements providing a delay time, the delay time being $(N+1)/N$ times the inverter delay time τ; and
a time calculator calculating a time interval between a point the first signal being inputted and another point the second signal being inputted from the value outputted by each of the Q terminals of the first through Nth D-type flip-flop circuits,
wherein one of the digital signals corresponding to the first flip-flop group is inputted to all the D terminals of the first through $N^{th}$ D-type flip-flop circuits in the first flip-flop group, a C terminal of second D-type flip-flop circuit in the first flip-flop group is connected to one end of first delay element, a C terminal of the first D-type flip-flop circuit in the first flip-flop group is connected to the other end of the first delay element, the other end of the first delay element is connected to the input terminal, and, when N, the number of flip-flop circuits in the first flip-flop group, is equal to or greater than 3, for each natural number J from 2 to N−1, C terminal of $(J+1)^{th}$ D-type flip-flop circuit in the first flip-flop group is connected to one end of $J^{th}$ delay element and one end of $(J-1)^{th}$ delay element is connected to other end of the $J^{th}$ delay element.

2. The time-to-digital converter according to claim 1, wherein
the time-to-digital converter comprises second through $M^{th}$ flip-flop groups each having different first through $N^{th}$ D-type flip-flop circuits, M being a natural number equal to or greater than 2, in addition to the first flip-flop group, and
wherein the phase information generator outputs first through $M^{th}$ digital signals, each of the digital signals having a phase different from one another by an amount corresponding to the predetermined time,
for each K a natural number from 1 to M, $K^{th}$ digital signal among the multiple digital signals outputted by the phase information generator is inputted to D terminals of the first through $N^{th}$ D-type flip-flop circuits in $K^{th}$ flip-flop group,
in every flip-flop group, C terminal of the second D-type flip-flop circuit is connected to the one end of the first delay element, in every flip-flop group, C terminal of the first D-type flip-flop circuit is connected to the other end of the first delay element, and, when N, the number of flip-flop circuits in one flip-flop group, is equal to or greater than 3, in every flip-flop group, C terminal of the $(J+1)^{th}$ D-type flip-flop circuit is connected to the one end of the $J^{th}$ delay element, and wherein the time calculator uses values outputted by the Q terminals of the first through Nth D-type flip-flop circuits of every flip-flop group to calculates the time interval.

3. The time-to-digital converter according to claim 2, wherein the phase information generator has first through $(M-1)^{th}$ inverter elements, each of the first through $(M-1)^{th}$ inverter elements being identical to the inverter element and having inverter delay time identical to the predetermined time, and wherein each of D terminals of the first through $N^{th}$ D-type flip-flop circuits in second flip-flop group is connected to one end of first inverter element, each of the D terminals of the first through $N^{th}$ D-type flip-flop circuits in the first flip-flop group is connected to the other end of the first inverter element, and, when M, the number of flip-flop groups, is equal to or greater than 3, for each L a natural number from 2 to M–1, each of D terminals of the first through $N^{th}$ D-type flip-flop circuits in $(L-1)^{th}$ flip-flop group is connected to one end of $L^{th}$ inverter element and one end of the $(L-1)^{th}$ inverter element is connected to the other end of the $L^{th}$ inverter element.

4. The time-to-digital converter according to claim 3, wherein the phase information generator is a ring oscillator.

5. The time-to-digital converter according to claim 4,
wherein the phase information generator has an $M^{th}$ inverter element whose inverter delay time is identical to the inverter delay time of the first through $(M-1)^{th}$ inverter elements, in addition to the first through $(M-1)^{th}$ inverter elements, and wherein each of the D terminals of the first through $N^{th}$ D-type flip-flop circuits in the second flip-flop group is connected to the one end of the first inverter element, each of the D terminals of the first through $N^{th}$ D-type flip-flop circuits in the first flip-flop group is connected to the other end of the first inverter element, one end of the $M^{th}$ inverter element is connected to the other end of the first inverter element, the other end of the $M^{th}$ inverter element is connected to one end of the $(M-1)^{th}$ inverter element, and, when M, the number of flip-flop groups, is equal to or greater than 3, each of D terminals of the first through $N^{th}$ D-type flip-flop circuits in the $(L+1)^{th}$ flip-flop group is connected to the one end of the $L^{th}$ inverter element and the one end of the $(L-1)^{th}$ inverter element is connected to the other end of the $L^{th}$ inverter element.

6. The time-to-digital converter according to claim 1, wherein the time-to-digital converter comprises a wavenumber counter measuring a wavenumber of the digital signal by receiving the digital signal outputted by the phase information generator.

* * * * *